United States Patent
Soga

(10) Patent No.: US 9,117,960 B2
(45) Date of Patent: Aug. 25, 2015

(54) ION IMPLANTATION METHOD, CARRIER, AND ION IMPLANTATION DEVICE

(71) Applicant: Sumitomo Heavy Industries, Ltd., Tokyo (JP)

(72) Inventor: Tomohiro Soga, Kanagawa (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 61 days.

(21) Appl. No.: 13/764,016

(22) Filed: Feb. 11, 2013

(65) Prior Publication Data

US 2013/0210183 A1  Aug. 15, 2013

(30) Foreign Application Priority Data

Feb. 9, 2012  (JP) ................. 2012-026715

(51) Int. Cl.
| | |
|---|---|
| H01L 31/18 | (2006.01) |
| H01L 31/0224 | (2006.01) |
| H01J 37/317 | (2006.01) |
| H01L 31/068 | (2012.01) |
| H01L 21/266 | (2006.01) |
| H01L 21/265 | (2006.01) |

(52) U.S. Cl.
CPC ............ *H01L 31/18* (2013.01); *H01J 37/3171* (2013.01); *H01L 21/266* (2013.01); *H01L 31/022425* (2013.01); *H01L 31/068* (2013.01); *H01L 31/1804* (2013.01); *H01J 2237/31711* (2013.01); *H01L 21/26513* (2013.01); *Y02E 10/547* (2013.01)

(58) Field of Classification Search
CPC ................. H01J 37/3171; H01J 2237/31711; H01J 37/20; H01L 21/266; H01L 31/18; H01L 31/022425
See application file for complete search history.

(56) References Cited

U.S. PATENT DOCUMENTS

| | | | |
|---|---|---|---|
| 6,335,534 B1* | 1/2002 | Suguro et al. | 250/492.21 |
| 6,930,316 B2* | 8/2005 | Nishihashi et al. | 250/492.21 |
| 2008/0038908 A1* | 2/2008 | Henley | 438/530 |
| 2009/0227062 A1* | 9/2009 | Sullivan et al. | 438/61 |
| 2010/0124799 A1* | 5/2010 | Blake et al. | 438/57 |
| 2010/0297782 A1* | 11/2010 | Riordon et al. | 438/5 |
| 2011/0027463 A1* | 2/2011 | Riordon et al. | 427/75 |
| 2011/0192993 A1* | 8/2011 | Chun et al. | 250/492.21 |
| 2012/0083102 A1* | 4/2012 | Bateman et al. | 438/527 |

FOREIGN PATENT DOCUMENTS

| | | |
|---|---|---|
| JP | 2011-513997 A | 4/2011 |
| WO | 2009/111665 A2 | 9/2009 |

* cited by examiner

*Primary Examiner* — Bac Au
(74) *Attorney, Agent, or Firm* — Fishman Stewart Yamaguchi PLLC

(57) ABSTRACT

An ion implantation method includes: placing, in an atmosphere, a mask, which is used in conjunction with a tray for accommodating a substrate for a solar cell, at a first position covering a partial area on a surface of the substrate while maintaining the mask aligned relative to the substrate or at a second position distanced from the surface of the substrate; implanting, in a vacuum, ions in a first area on the surface of the substrate while the mask is placed at the first position; and implanting, in a vacuum, ions in a second area on the surface of the substrate while the mask is placed at the second position.

17 Claims, 9 Drawing Sheets

10

10

11

11

11

11

11

11

ION IMPLANTATION METHOD, CARRIER, AND ION IMPLANTATION DEVICE

BACKGROUND

1. Technical Field

The present invention relates to an ion implantation method, a carrier, and an ion implantation device.

2. Description of the Related Art

A solar cell is configured such that electron-hole pairs generated when a semiconductor material such as silicon absorbs light are subject to an electric field of the pn-junction formed in the solar cell so that electrons move to the n-type layer and protons move to the p-type layer and an electric current is retrieved in an external circuit accordingly. For formation of a pn-junction and a contact layer, it is necessary to process the material so that the concentration and type of impurities differ from one place to another. Ion implantation is used in such a process.

For example, there is known a device adapted to implant ions on the surface of a substrate multiple time in order to produce an impurity profile that improves the efficiency of a solar cell. In the first step, the device is evacuated and ions are implanted in the substrate. This is followed by placement of a mask on the substrate inside the device. The second step of ion implantation is subsequently performed.

SUMMARY

The ion implantation method according to at least one embodiment of the present invention comprises: placing, in an atmosphere, a mask, which is used in conjunction with a tray for accommodating a substrate for a solar cell, at a first position covering a partial area on a surface of the substrate while maintaining the mask aligned relative to the substrate or at a second position distanced from the surface of the substrate; implanting, in a vacuum, ions in a first area on the surface of the substrate while the mask is placed at the first position; and implanting, in a vacuum, ions in a second area on the surface of the substrate while the mask is placed at the second position.

Another embodiment of the present invention relates to a carrier. The carrier is adapted to carry a substrate for a solar cell into an ion implantation device, the carrier comprising: a tray configured to accommodate the substrate; a mask configured to be moved between a first position covering a partial area on a surface of the substrate while the mask is being aligned relative to the substrate and a second position distanced from the surface of the substrate; and a joining mechanism configured to join the mask and the tray so that the mask is moveable between the first position and the second position.

Still another embodiment of the present invention relates to an ion implantation device. The ion implantation device is adapted to implant ions in a substrate for a solar cell, the device comprising: a table on which the carrier is mounted; an ion implantation source configured to implant ions on the substrate accommodated in the carrier; a vacuum device configured to evacuate a processing chamber in which the ion implantation source is provided; a transport unit configured to transport the carrier from the table to the processing chamber; and a moving mechanism configured to move the mask in the carrier between the first position and the second position in the evacuated processing chamber.

BRIEF DESCRIPTION OF THE DRAWINGS

Embodiments will now be described, by way of example only, with reference to the accompanying drawings, which are meant to be exemplary, not limiting, and wherein like elements are numbered alike in several figures, in which.

DETAILED DESCRIPTION

Figure 1A:
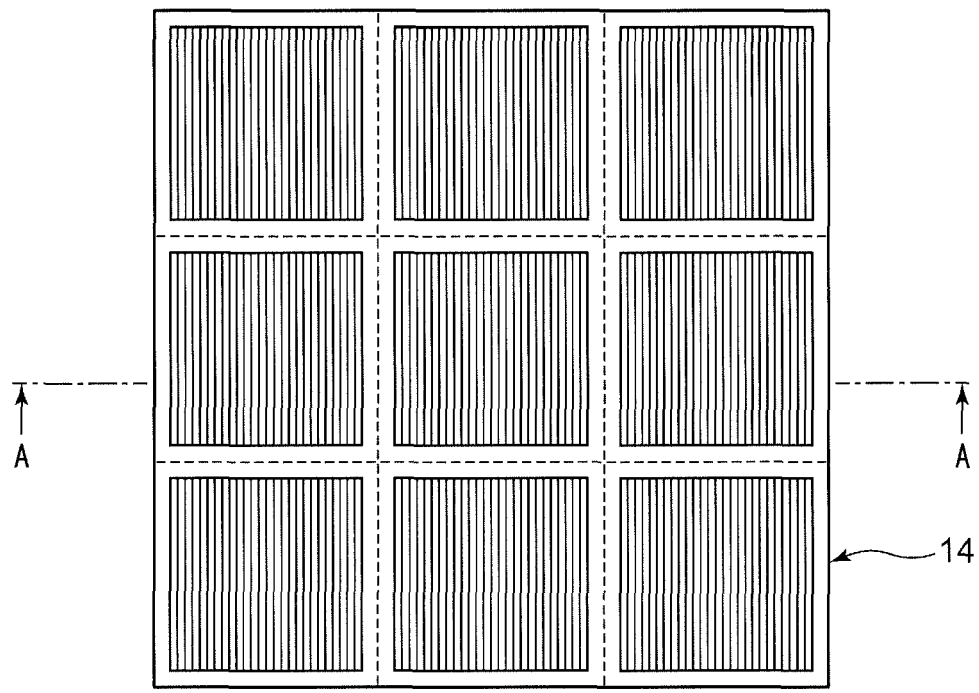
FIG. 1A is top view of the carrier according to the first embodiment.

The invention will now be described by reference to the preferred embodiments. This does not intend to limit the scope of the present invention, but to exemplify the invention.

It is not easy to align a substrate and a mask inside an evacuated device. The mask need be replaced when it is worn or contaminated. For replacement, the vacuum should be eliminated and the operation of the device should be suspended. An increase in the duration of suspension of device operation leads to an increase in the cost of manufacturing solar cells.

In this background, there is a need to provide a technology capable of improving productivity in a device adapted to implant ions on the surface of a substrate for a solar cell.

A detailed description will be given below of an embodiment for implementing the present invention. The structure described below is by way of example only and does not limit the scope of the present invention.

The ion implantation method according to the embodiment comprises: placing, in an atmosphere, a mask, which is used in conjunction with a tray for accommodating a substrate for a solar cell, at a first position covering a partial area on a surface of the substrate while maintaining the mask aligned relative to the substrate or at a second position distanced from the surface of the substrate; implanting, in a vacuum, ions in a first area on the surface of the substrate while the mask is placed at the first position; and implanting, in a vacuum, ions in a second area on the surface of the substrate while the mask is placed at the second position. The term "surface" is non-limiting as to surface of the substrate and encompasses both the upper and lower surfaces.

In an ion implantation method such as this which comprises at least two steps of implanting ions as impurities, ions can be implanted in different areas in the respective implantation steps by using a mask. Such implantation steps can be employed in forming a selective emitter in a solar cell manufacturing process. For example, the first implantation step may be used to form a selective emitter. A monocrystal silicon wafer may be used as a substrate of a solar cell.

The mask covers a predetermined area on the substrate and allows ions to be implanted on the substrate surface outside the covered area. The mask is formed with a slit of a predetermined pattern and ions are implanted in the substrate surface in accordance with the pattern. Therefore, accuracy of alignment between the substrate and the mask is vital when it is necessary to accurately dope a predetermined area on the substrate with impurities.

For example, the mask may be moved relative to the substrate inside the evacuated device so as to align the substrate and the mask. However, it is difficult to align the substrate and the mask accurately and efficiently. Attempts to achieve accurate and efficient alignment increase the complexity of the device. The mask need be replaced when it is worn or contaminated. For replacement, the vacuum should be eliminated and the operation of the device should be suspended. An increase in the duration of suspension of device operation leads to an increase in the cost of manufacturing solar cells.

In contrast, the ion implantation method comprises placing, in an atmosphere, a mask, which is used in conjunction with a tray for accommodating a substrate for a solar cell, at a first position covering a partial area on a surface of the substrate while maintaining the mask aligned relative to the substrate or at a second position distanced from the surface of the substrate. Therefore, it is easy to place the mask relative to the tray properly. In particular, when the mask is placed at the first position in the atmosphere, it is not necessary to perform the extra step of aligning the substrate and the mask in the vacuum device in which ion implantation is performed. Since the mask is placed in the atmosphere relative to the tray, visual inspection of the wear and contamination of the mask is easy so that the task of replacement is facilitated. The term "in the atmosphere" not only refers to one atmospheric pressure or so, but is inclusive of a work atmosphere that can be achieved easily without requiring a large-scale device such as a vacuum device.

The mask may be of any form so long as it can be used in conjunction with the tray. For example, a mask having a size comparable to that of the tray and formed as a plate-shaped cover capable of covering the substrate may suitably be used. This reduces the thickness of the carrier comprising the tray accommodating the substrate and the mask as integrated and reduces the freight space and the space required for transportation. The mask is suitably formed of a material including at least one of silicon, carbon, and glass as a main component. Metal or ceramic may also be used to form the mask.

The phrase "used in conjunction with the tray" not only encompasses a case in which the mask and the tray are inseparably joined via parts thereof but also a case in which they are separable. In either case, another member may be interposed between the mask and the tray. The phrase "maintaining the mask aligned relative to the substrate" not only encompasses a case in which the mask is directly aligned relative to the substrate but also a case in which the mask is indirectly aligned relative to the substrate via another member (e.g., the tray). In other words, the phrase encompasses a case in which the mask is aligned relative to the substrate as a result of the mask being aligned relative to the tray and the tray being aligned relative to the substrate. Further, the phrase "(the mask is) distanced from the surface of the substrate" not only encompasses a case in which the mask is completely distanced from the surface of the substrate but also a case in which the mask is moved from the surface of the substrate to a distance where the mask is nonfunctional during ion implantation.

First Embodiment

A description will now be given of an illustrative structure of the ion implantation device and of the carrier and the ion implantation method according to the embodiment.

(Carrier)

Figure 1B:
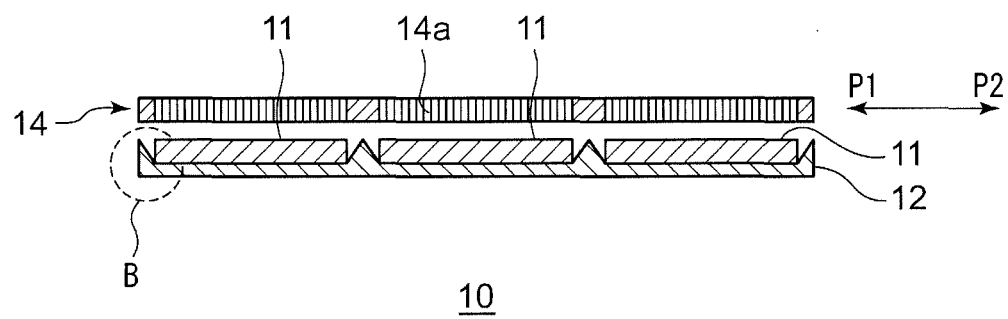
FIG. 1B is a A-A section of FIG. 1A.
Figure 2:
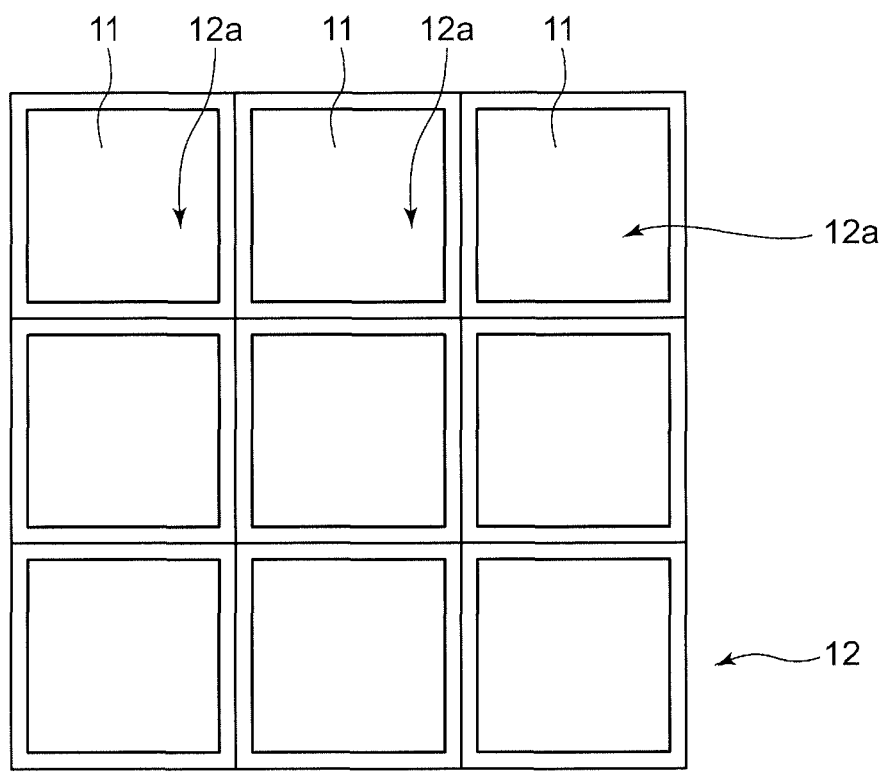
FIG. 2 is a top view of the tray of the carrier.

FIG. 1A is top view of the carrier according to the first embodiment, and FIG. 1B is a A-A section of FIG. 1A. FIG. 2 is a top view of the tray of the carrier. Illustration of the mask is omitted in FIG. 2.

The carrier 10 shown in FIG. 1 is configured to carry a substrate for a solar cell to into the ion implantation device described later. The carrier 10 comprises a tray 12 for accommodating a substrate 11 for a solar cell at a predetermined position, a mask 14 covering a partial area on the surface of the substrate; and a joining mechanism (not shown in FIG. 1) for joining the tray 12 and the mask 14. A specific example of the joining mechanism will be described later.

As shown in FIG. 2, the tray 12 is provided with a plurality of containers 12a for accommodating a plurality of substrates 11 respectively. In the example of the tray 12 according to the embodiment, the containers 12a comprise 9 recesses organized in a 3×3 matrix. The substrate 11 is accommodated in each recess. Each recess is a square area suited to the size of the substrate and allows for tolerance of the substrate and a margin for accommodation. Each recess is a square area of about 150-200 mm on one side.

The mask 14 is formed with a plurality of slits 14a. In the case of selective emitters presently in use, the interval between adjacent slits is approximately 2-4 mm, and the stencil width is approximately 100-500 μm.

Figure 3:
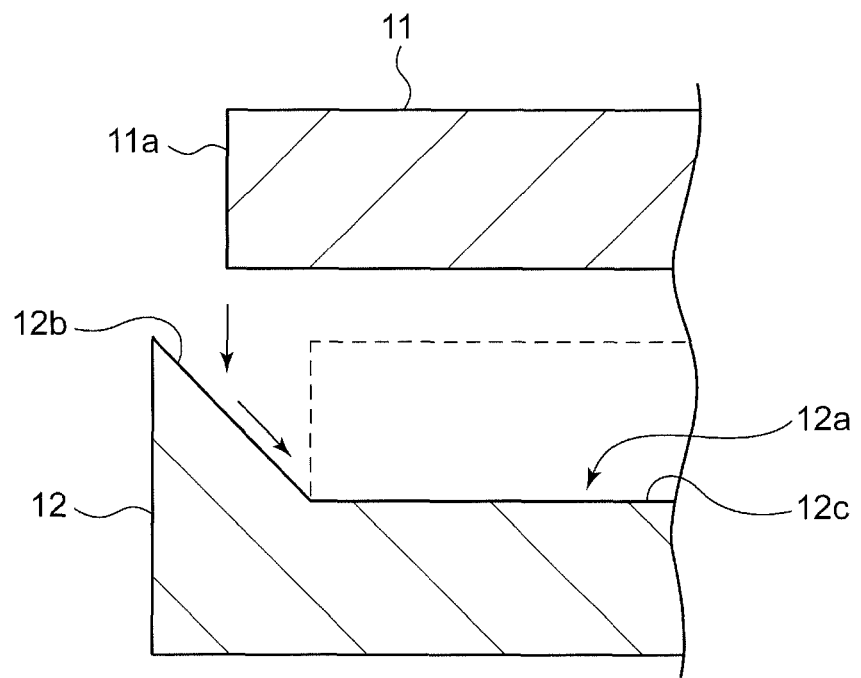
FIG. 3 is an enlarged view of region B shown in FIG. 1B.

FIG. 3 is an enlarged view of region B shown in FIG. 1B. An outer edge portion 12b of the container 12a of the tray 12 is tapered toward a bottom 12c. Therefore, even if the substrate 11 is displaced relative to the bottom 12c of the container 12a as the substrate 11 is mounted on the tray 12, the position of an edge portion 11a of the substrate 11 is gradually corrected toward the bottom 12c to a predefined position along the outer edge portion 12b. This causes the substrate 11 to be ultimately placed at the predefined position of the bottom 12c. Thus, the outer edge portion 12b and the bottom 12c help the substrate 11 to be placed at the predefined position.

Figure 4A:
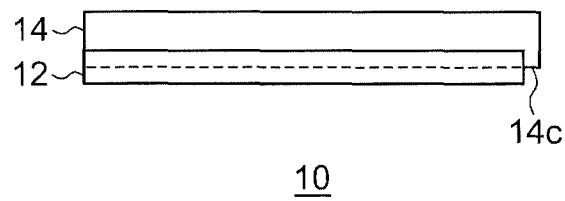
FIGS. 4A and 4B schematically show an exemplary joining mechanism for joining the tray and the mask.
Figure 4B:
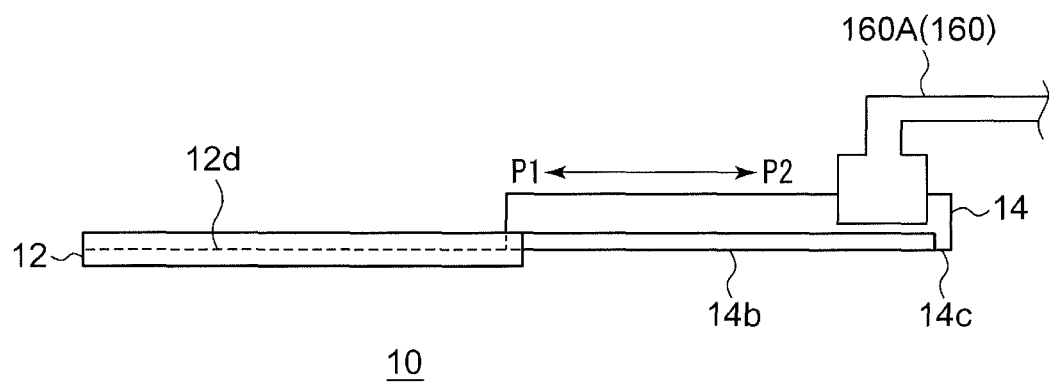

FIGS. 4A and 4B schematically show an example of joining mechanism for joining the tray and the mask. FIG. 4A shows a state in which the mask is at the first position P1 in which the mask, aligned relative to the substrate, covers a partial area of the surface of the substrate, and FIG. 4B shows a state in which the mask is at the second position P2 distanced from the surface of the substrate.

The tray 12 and the mask 14, at the first position P1 shown in FIG. 4A, are joined to each other by a groove 12d (or a protruding ridge 14b) formed in the tray or 12 or the mask 14 being engaged with a protruding ridge 14b (or a groove 12d) formed in the tray 12 or the mask 14. This allows the mask 14 to be moved between the first position P1 and the second position P2. The mask 14 is provided with a contact portion 14c aligned relative to the substrate 11 or the tray 12 by being into contact with the substrate 11 or the tray 12 while the mask is placed at the first position P1. This allows the mask 14 to be aligned relative to the substrate 11 only by moving the mask 14 to the first position P1.

(Ion Implantation Device)

Figure 5:
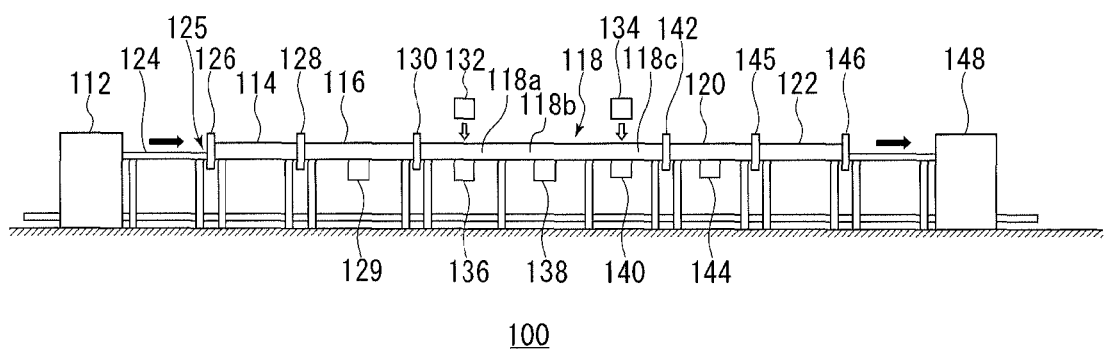
FIG. 5 schematically shows the structure of the ion implantation device according to the first embodiment.

FIG. 5 schematically shows the structure of an ion implantation device 100 according to the first embodiment. As shown in FIG. 5, the ion implantation device 100 is configured to implement the ion implantation method according to the embodiment. The ion implantation device 100 comprises: a load lock chamber (hereinafter, referred to as "LC" as necessary) configured to temporarily accommodate the carrier 10 transported from a transport robot 112 and provided with a roughing mechanism for communication from atmosphere to vacuum and with a vent mechanism using nitrogen etc., as a vent gas; process chambers (hereinafter, referred to as "PC" as necessary) 118a and 118c maintained in an evacuated or virtually evacuated state and provided with ion implantation sources 132 and 134, respectively; three buffer chambers (hereinafter, referred to as "BC" as necessary) 116, 118b, and 120 each placed before and after the process chamber and provided with a mask drive mechanism inside, the buffer chambers being capable of being maintained at an evacuated or virtually evacuated state; and an unload lock chamber (hereinafter, referred to as "ULC" as necessary) 122 configured to temporarily house the carrier 10 when the carrier 10 is transported outside the vacuum chamber, and provided with a vent mechanism using nitrogen etc. as a vent gas for communication from vacuum to atmosphere. The BCs 116, 118b, and 120 are provided to relieve the impact from communication with vacuum and to stabilize the pressure in the PC 118a and PC 118c. Therefore, the BCs 116, 118b, and 120 may be omitted by designing the size of the LCs and the PCs as such or by relocating the mask drive mechanism elsewhere.

The ion implantation device 100 also comprises a table 124 on which the carrier 10 transported by the transport robot 112 from a preceding process is carried, and a transport unit 125 configured to transport the carrier 10 from the table 124 to the chambers. The preceding process is exemplified by a process of forming irregularities (texture) on the surface of the substrate. The step is performed to scatter light on the surface of the substrate in order to promote absorption of light in a solar cell. The transport unit 125 is implemented by, for example, a belt-driven system. The transport unit 125 according to the embodiment is configured such that the carrier 10 can move linearly and continuously inside the ion implantation device 100.

In the ion implantation device 100 shown in FIG. 5, the carrier 10 is placed on the table 124 while the mask is placed at the first position P1 in the atmosphere. The carrier 10 placed on the table 124 is fed by the transport unit 125 to the LC 114. Once the carrier has been transported into the LC 114, a gate valve 126 between the LC 114 and the table 124 is closed. When a predetermined rough vacuum level is achieved by a roughing pump connected to the LC 114, a gate valve 128 between the LC 114 and the BC 116 is opened. After the carrier 10 is fed to the BC 116, the gate valve 128 is closed, and the LC 114 is vented by nitrogen etc. so as to be ready for transportation of the next carrier.

The interior of the BC 116 is maintained in a high vacuum state at all times by a turbo molecular pump (hereinafter, referred to as "TMP" as necessary) 129. Therefore, the carrier transported into the BC 116 instantaneously reaches a high vacuum atmosphere. At this stage, the mask in the carrier 10 is moved to the second position P2. When the mask is moved completely, a gate valve 130 provided between the BC 116 and the PC 118, where ion implantation is performed, is opened. The carrier 10 is transported from the BC 116 to the PC 118 on a belt. Subsequently, the gate valve 130 is closed.

The PC 118 comprises three processing chambers PC 118a, BC 118b, and PC 118c. No gate valves are provided between the chambers and the chambers communicate with each other in a high vacuum state. The ion implantation sources 132 and 134, which can be configured to permit setup with different conditions, are provided in the PCs 118a and 118c, respectively. Three TMPs 136, 138, and 140 associated with the PC 118, the BC 118b, and the PC 118c, respectively, are provided. The TMPs 136, 138, and 140 are capable of maintaining the PC 118 in a vacuum state.

Figure 6A:
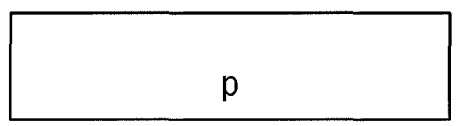
FIGS. 6A-6C schematically show how the concentration of impurities in the substrate varies in the ion implantation method according to the first embodiment.
Figure 6B:
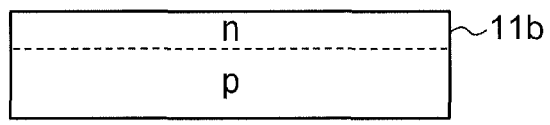
Figure 6C:
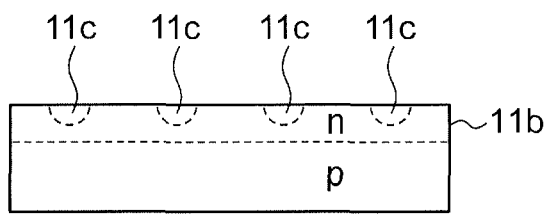

FIGS. 6A-6C schematically show how the concentration of impurities in the substrate varies in the ion implantation method according to the first embodiment. The following description assumes that the substrate 11 is a p-type silicon wafer (FIG. 6A), but the description also applies to an n-type silicon wafer or semiconductor substrates of other types.

When the carrier 10 is transported to the PC 118a of the PC 118, the mask 14 is placed at the second position P2. In this state, the ion implantation source 132 ionizes a $PH_3$ gas containing n-type impurities by arc discharge or high-frequency discharge, field-accelerates the ions, and implants the ions on the entirety of the substrate 11. As shown in FIG. 6B, this forms a n-layer 11b on the entirety of the surface of the substrate 11.

Subsequently, the carrier 10 accommodating the substrate 11 is transported to the BC 118b in the next stage. In the processing chamber 118b maintained in a vacuum state, the mask 14 in the carrier 10 is moved from the second position P2 to the first position P1. A moving mechanism 160 for moving the mask 14 from the second position to the first position may be implemented in a variety of ways. For example, the moving mechanism 160 may be implemented by a robot arm 160A provided in the PC 118 (see FIG. 4). Alternatively, inside the PC 118 may be provided an engagement part configured to move the mask 14 relative to the tray 12 by being engaged with a part of the carrier 10 or the mask 14 as transported. Either way, the moving mechanism need not align the mask 14 relative to the substrate 11 accurately and need only move the mask 14 between the first position P1 and the second position P2. Therefore, the structure of the mechanism can be simplified. The vacuum does not present any particular problem in moving the mask 14 between the first position P1 and the second position P2.

The carrier 10 in which the mask 14 is placed at the first position P1 is transported to the PC 118c in the next stage. The ion implantation source 134 ionizes a $PH_3$ gas containing n-type impurities by arc discharge or high-frequency discharge, field-accelerates the ions, and implants the ions on the entirety of the substrate 11. As shown in FIG. 6C, this forms an n+ layer 11c with higher concentration of impurities than the n layer 11b in a predetermined area on the surface of the substrate 11. The emitter structure such as this is called a selective emitter layer and contributes to reduction of contact resistance between a finger (comb tooth), which is formed in the post-process of a solar cell manufacturing process, and the substrate 11.

When the two-stage implantation process is completed, a gate valve 142 is opened and the carrier 10 is transported into the BC chamber 120 in the next stage, whereupon the gate valve 142 is closed. A TMP 144 for achieving a predetermined vacuum level is provided in the vacuum chamber 120. When the gate valve 142 is closed, a gate valve 145 provided between the vacuum chamber 120 and the ULC 122 is opened. The carrier 10 is then transported to the ULC 122 and the gate valve 145 is closed. Subsequently, the ULC 122 is vented by using nitrogen etc. as a vent gas. Then, a gate valve 146 is opened so that the carrier 10 is transported into the atmosphere. When the carrier 10 is transported into the atmosphere, the gate valve 146 is closed again and the ULC 122 is roughly evacuated by a roughing pump so as to transport the next carrier 10. Downstream of the ion implantation device 10 is provided a transport robot 148 for transporting the carrier 10, which stores the substrate 11 implanted with ions, to the post-process. The carriers 10 transported to the transport robot 148 are sequentially accommodated in the transport robot 148 and carried to the post-process. If a deficiency is identified in the mask at this point of time, the mask can be replaced easily. Therefore, the operation of the device need not be suspended as in the case of replacing the mask in the vacuum device. Accordingly, down time of the device can be reduced and the productivity can be improved.

Figure 7:
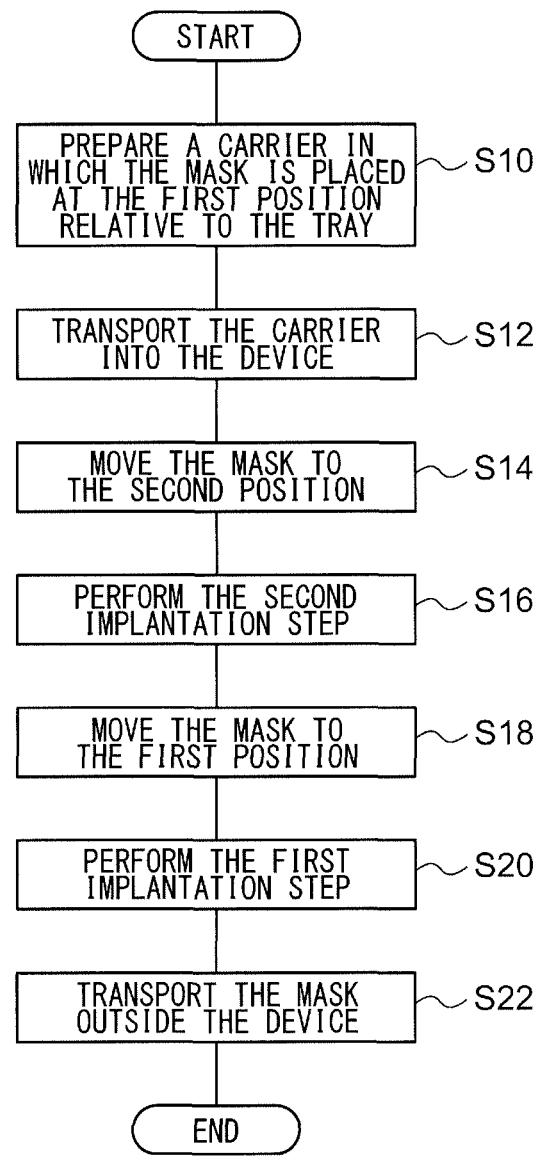
FIG. 7 is a flowchart that summarizes the steps of the ion implantation method according to the first embodiment.

FIG. 7 is a flowchart that summarizes the steps of the ion implantation method according to the first embodiment. As described above, the carrier 10, in which the mask 14 is placed at the first position P1 relative to the tray 12, is prepared in the atmosphere (S10). The carrier 10 is transported into the ion implantation device 100 (S12). Inside the BC 116, the mask 14 in the carrier 10 is moved to the second position P2 (S16). In the PC 118a of the PC 118, the second implantation step is performed to implant ions on the entirety of the surface of the substrate 11 (S18).

In the BC 118b, the mask 14 in the carrier 10 is moved to the first position P1 (S20). In the PC 118c, the first implantation step is performed to selectively implant ions in the substrate 11 (S20). When the ions are implanted, the carrier 10 is transported outside the device (S22).

As described above, because the carrier 10 is configured such that the mask 14 is placed either at the first predetermined position P1 or at the second predetermined position P2 relative to the tray 12 accommodating the substrate 11, it is not necessary to detect the position of the tray or the mask accurately in the vacuum. It is therefore not necessary to detect or align the position and the productivity of the ion implantation device can be improved. Assuming hypothetically that ions are implanted while the mask is at the second position and that the mask is then moved to the first position to implant ions further, accurate alignment between the mask and the substrate is possible merely by moving the mask to the predetermined first position relative to the tray.

Second Embodiment

Figure 8:
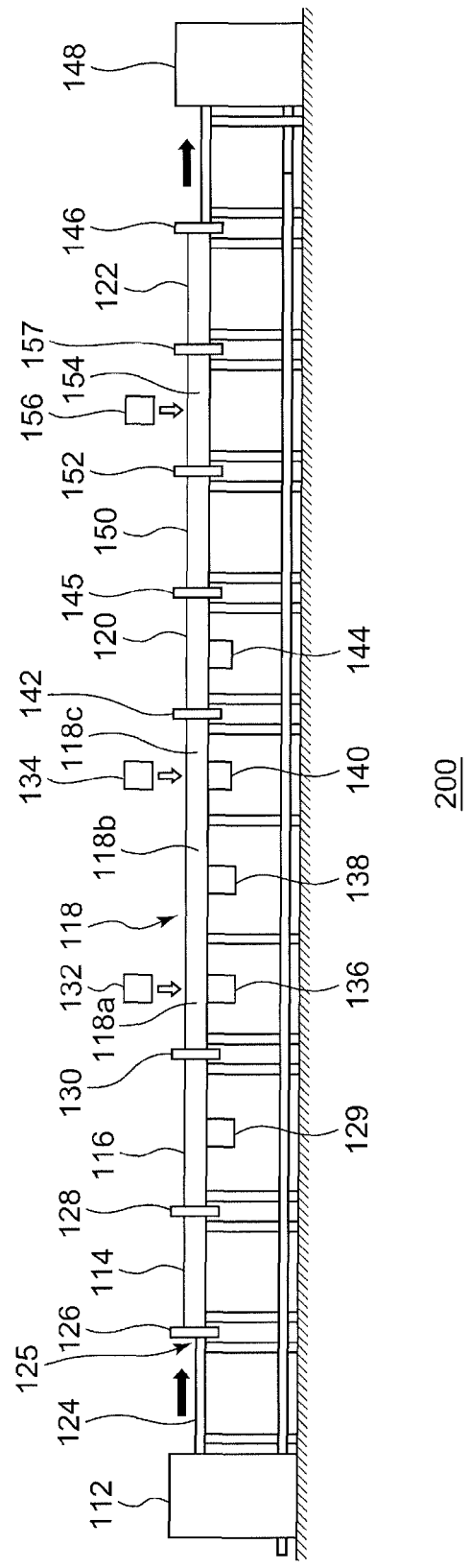
FIG. 8 schematically shows the structure of the ion implantation device according to the second embodiment.

FIG. 8 schematically shows the structure of an ion implantation device 200 according to the second embodiment. The features identical to those of the ion implantation device 100 according to the first embodiment are denoted by the same reference signs and a description thereof is omitted. The primary feature of the ion implantation device 200 according this embodiment is that an anneal chamber where the substrate implanted with ions is annealed is provided, and that the second implantation step is performed after the first implantation step.

As in the case of the first embodiment, the carrier 10 is placed on the table 124 while the mask is placed at the first position P1 in the atmosphere. The carrier 10 in this state is transported to the PC 118, where ions are implanted, via the LC 114 and the BC 116. Thus, according to the second embodiment, the mask in the carrier 10 is not moved from the first position P1 to the second position P2 in the BC 116. Therefore, it is not necessary to provide the BC 116 with a moving mechanism for moving the mask position.

Figure 9A:
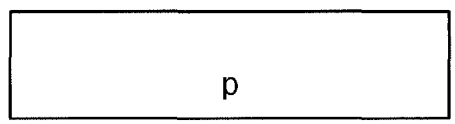
FIGS. 9A-9C schematically show how the concentration of impurities in the substrate varies in the ion implantation method according to the second embodiment.
Figure 9B:
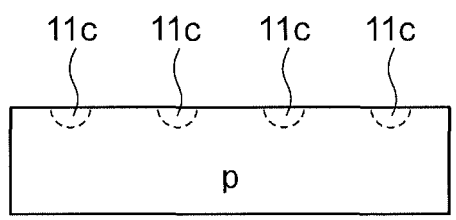
Figure 9C:
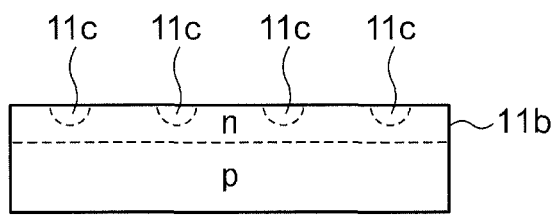

FIGS. 9A-9C schematically show how the concentration of impurities in the substrate varies in the ion implantation method according to the second embodiment. The substrate 11 is a p-type silicon wafer (FIG. 9A) as in the case of the first embodiment.

In the carrier 10 transported into the processing chamber 118a of the PC 118, the mask 14 is placed at the first position P1. In this state, the ion implantation source 132 ionizes a $PH_3$ gas etc., containing n-type impurities by arc discharge or high-frequency discharge, field-accelerates the ions, and implants the ions on a predetermined area on the surface of the substrate 11. As shown in FIG. 9B, this forms an n+ layer 11c with high concentration of impurities in a predetermined area on the surface of the substrate 11.

Subsequently, the carrier 10 accommodating the substrate 11 is transported to the processing chamber 118b in the next stage. In the processing chamber 118b maintained in a vacuum state, the mask 14 in the carrier 10 is moved by the aforementioned moving mechanism from the first position P1 to the second position P2. A moving mechanism for moving the mask 14 from the first position to the second position is provided in the processing chamber 118b.

The carrier 10 in which the mask 14 is placed at the second position P2 is transported to the PC 118c in the next stage. The ion implantation source 134 ionizes a $PH_3$ gas containing n-type impurities by arc discharge or high-frequency discharge, field-accelerates the ions, and implants the ions on the entirety of the substrate 11. As shown in FIG. 9C, this forms the n-layer 11b on the entirety of the surface of the substrate 11 including the n+ layer 11c. As described above, according to the ion implantation method of the second embodiment, the first implantation step and the second implantation step can be performed continuously in the stated order, without breaking the vacuum.

When the two-stage implantation process is completed, the gate valve 142 is opened and the carrier 10 is transported into the vacuum chamber 120 in the next stage, whereupon the gate valve 142 is closed. A TMP 144 for achieving a predetermined vacuum level is provided in the vacuum chamber 120. When the gate valve 142 is closed, a gate valve 145 provided between the vacuum chamber 120 and an adjacent vacuum chamber 150 is opened. The carrier 10 is then transported to the next vacuum chamber (buffer chamber) 150 and the gate valve 145 is closed. The buffer chamber is not maintained in high vacuum and is subsequently vented by using nitrogen etc. as a vent gas before being delivered to the anneal chamber in the following stage. If the anneal chamber is of a type such as a lamp anneal chamber capable of processing the substrate in high vacuum, the buffer chamber may be omitted.

Subsequently, a gate valve 152 is opened. After the carrier 10 is transported to an anneal chamber 154, the gate valve 152 is closed. A heating means 156 is for annealing the substrate is provided in the anneal chamber 154. An electrically-heated wire, laser heating, or a hearing lamp may be used as the heating means 156. In an anneal process, the entirety of the substrate need be heated and so it is not preferable that the surface of the substrate is covered by the mask, i.e., that the mask is at the first position. Since the anneal process for annealing the substrate 11 is performed subsequent to the second implantation process in the ion implantation device 200, the carrier 10 can be transported to the anneal chamber 154 while the mask is at the second position. In this case, the surface of the substrate is exposed to the heating means 156 in the anneal chamber 154 so that the substrate can be annealed uniformly while the mask is at the second position. The moving mechanism for moving the position of the mask need not be provided downstream of the PC 118.

Subsequently, a gate valve 157 provided between the anneal chamber 154 and the ULC 122 is opened, the carrier 10 is transported to the ULC 122, and the gate valve 157 is closed. The gate valve 146 is ultimately opened so that the carrier 10 is transported into the atmosphere.

As described above, according to the embodiments of the present invention, the productivity of an ion implantation device for implanting ions on the surface of the substrate for a solar cell can be improved. Since the carrier in which the substrate and the mask are aligned relative to each other is introduced into the device, a complex and expensive alignment mechanism such as an XY stage or an optical sensing system for alignment of the substrate and the mask is not necessary so that the manufacturing cost can be reduced.

Further, since the process of aligning the substrate and the mask inside a processing chamber such as a vacuum chamber can be simplified and less labor intensive, the performance of processing the substrate for a solar cell is improved. Further, the mask is discharged into the atmosphere along with the tray after a series of processes. Therefore, maintenance and management of the mask, such as cleaning and replacement of the mask due to abrasion of the mask slit or due to the collection of impurities, are facilitated.

The embodiment described above is non-limiting and it will be obvious to those skilled in the art that combination or replacement of features of the embodiments will also be encompassed by the present invention. Modifications to the design, etc. of the ion implantation device, carrier, etc. according to the embodiments on the basis of the knowledge of a skilled person will also be possible, and the embodiments modified as such will also be within the scope of the present invention.

The carrier may not be of batch tray type in which a plurality of substrates can be mounted simultaneously but may be of sheet type in which only a single substrate can be mounted. In the case that the carrier is of batch tray type in which a plurality of substrates can be mounted simultaneously, the number of substrates that can be mounted in the carrier may not be limited to 9, but 4, 16, . . . substrates may be mounted in the carrier.

The tray may not necessarily be shaped as described so long as a mechanism capable of mechanically aligning the substrate as mounted relative to the tray within a tolerance is provided. The container provided in the tray may not necessarily be square shaped but may be alternatively shaped to conform to the shape of the substrate.

The first implantation step and the second implantation step may not necessarily be performed to form a selective emitter layer and a global emitter layer but may be used in other steps of manufacturing a solar cell or a semiconductor.

The carrier may not be structured such that the mask slides in one direction relative to the tray but may be structured such that the carrier opens and closes around a rotational axis parallel to one side of the tray, or the carrier may be partitioned to open and close in a plurality of directions.

It should be understood that the invention is not limited to the above-described embodiment, but may be modified into various forms on the basis of the spirit of the invention. Additionally, the modifications are included in the scope of the invention.

Priority is claimed to Japanese Patent Application No. 2012-026715, filed Feb. 9, 2012, the entire content of which is incorporated herein by reference.

What is claimed is:

1. A carrier for carrying a substrate for a solar cell into an ion implantation device, comprising:
   the carrier is configured to carry the substrate from an atmosphere into a process chamber of an ion implantation device;
   a tray configured to accommodate the substrate;
   a mask configured to be moved between a first position covering a partial area on a surface of the substrate and a second position distanced from the surface of the substrate, while the mask is being aligned relative to the substrate; and
   a joining mechanism configured to join the mask and the tray so that the mask is moveable between the first position and the second position.

2. The carrier according to claim 1,
   wherein the tray includes an alignment part configured to align the substrate at a predetermined position, and
   wherein the mask includes a contact part aligned by coming into contact with the substrate or the tray while the mask is at the first position.

3. The carrier according to claim 2,
   wherein the tray includes a plurality of containers for accommodating the plurality of substrates.

4. The carrier according to claim 1,
   wherein the tray includes a plurality of containers for accommodating the plurality of substrates.

5. An ion implantation device for implanting ions in a substrate for a solar cell, comprising:
   a table on which a carrier configured to carry the substrate from an atmosphere into a process chamber of the ion implantation is mounted, the carrier including:
      a tray configured to accommodate the substrate;
      a mask configured to be moved between a first position covering a partial area on a surface of the substrate and a second position distanced from the surface of the substrate, while the mask is being aligned relative to the substrate; and
      a joining mechanism configured to join the mask and the tray so that the mask is moveable between the first position and the second position;
   an ion implantation source configured to implant ions on the substrate accommodated in the carrier;
   a vacuum device configured to evacuate a processing chamber in which the ion implantation source is provided;
   a transport unit configured to transport the carrier from the table to the processing chamber; and
   a moving mechanism configured to move the mask in the carrier between the first position and the second position in the evacuated processing chamber.

6. An ion implantation method for the ion implantation device according to claim 5 comprising the steps of:
   placing, in the atmosphere, the mask, which is used in conjunction with the tray, at the first position covering the partial area on the surface of the substrate while maintaining the mask aligned relative to the substrate or at the second position distanced from the surface of the substrate;
   implanting, as a first implantation step, in a vacuum, ions in a first area on the surface of the substrate while the mask is placed at the first position; and
   implanting, as a second implantation step, in a vacuum, ions in a second area on the surface of the substrate while the mask is placed at the second position.

7. The ion implantation method according to claim 6,
   wherein the mask is only moved to the first position, and
   wherein the second implantation step is performed after the first implantation step.

8. The ion implantation method according to claim 7, further comprising:
   annealing the substrate,
   wherein the annealing is performed after the second implantation step and while the mask is placed at the second position.

9. The ion implantation method according to claim 8, further comprising:
   moving the mask between the first position and the second position in a vacuum.

10. The ion implantation method according to claim 7, further comprising:
   moving the mask between the first position and the second position in a vacuum.

11. The ion implantation method according to claim 6, further comprising:
   annealing the substrate,
      wherein the annealing is performed after the second implantation step and while the mask is placed at the second position.

12. The ion implantation method according to claim 11, further comprising:
   moving the mask between the first position and the second position in a vacuum.

13. The ion implantation method according to claim 12, wherein the mask is moved between the first implantation step and the second implantation step.

14. The ion implantation method according to claim 6, further comprising:
   moving the mask between the first position and the second position in a vacuum.

15. The ion implantation method according to claim 14, wherein the mask is moved between the first implantation step and the second implantation step.

16. A carrier for carrying a substrate for a solar cell into an ion implantation device, comprising:
   a tray configured to accommodate the substrate;
   a mask configured to be moved between a first position covering a partial area on a surface of the substrate and a second position distanced from the surface of the substrate, while the mask is being aligned relative to the substrate; and
   a joining mechanism configured to join the mask and the tray so that the mask is moveable between the first position and the second position;
   wherein the tray includes an alignment part configured to align the substrate at a predetermined position, and
   wherein the mask includes a contact part aligned by coming into contact with the substrate or the tray while the mask is at the first position.

17. The carrier according to claim 16, wherein the tray includes a plurality of containers for accommodating the plurality of substrates.

* * * * *